United States Patent
Yamaguchi et al.

(10) Patent No.: US 12,166,135 B2
(45) Date of Patent: *Dec. 10, 2024

(54) TFT CIRCUIT BOARD AND DISPLAY DEVICE HAVING THE SAME

(71) Applicant: Japan Display Inc., Tokyo (JP)

(72) Inventors: Yohei Yamaguchi, Tokyo (JP); Kazufumi Watabe, Tokyo (JP); Tomoyuki Ariyoshi, Tokyo (JP); Osamu Karikome, Tokyo (JP); Ryohei Takaya, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/346,927

(22) Filed: Jul. 5, 2023

(65) Prior Publication Data

US 2023/0361220 A1 Nov. 9, 2023

Related U.S. Application Data

(63) Continuation of application No. 17/347,630, filed on Jun. 15, 2021, now Pat. No. 11,742,430, which is a continuation of application No. 15/649,126, filed on Jul. 13, 2017, now Pat. No. 11,063,154.

(30) Foreign Application Priority Data

Jul. 19, 2016  (JP) .................................. 2016-141228

(51) Int. Cl.
*H01L 29/786* (2006.01)
*H01L 27/12* (2006.01)
*H01L 29/40* (2006.01)
*H01L 29/423* (2006.01)
(Continued)

(52) U.S. Cl.
CPC ...... *H01L 29/7869* (2013.01); *H01L 27/1214* (2013.01); *H01L 27/1225* (2013.01); *H01L 27/124* (2013.01); *H01L 27/1248* (2013.01); *H01L 29/401* (2013.01);
(Continued)

(58) Field of Classification Search
None
See application file for complete search history.

(56) References Cited

U.S. PATENT DOCUMENTS

| | | | | |
|---|---|---|---|---|
| 8,115,208 | B2 * | 2/2012 | Liu | H01L 27/1229 438/782 |
| 8,298,875 | B1 * | 10/2012 | Or-Bach | H01L 27/0694 438/141 |
| 9,082,860 | B2 * | 7/2015 | Nakano | H01L 29/42364 |

(Continued)

*Primary Examiner* — Telly D Green
(74) *Attorney, Agent, or Firm* — Michael Best & Friedrich LLP

(57) ABSTRACT

The invention allows stable fabrication of a TFT circuit board used in a display device and having thereon an oxide semiconductor TFT. A TFT circuit board includes a TFT that includes an oxide semiconductor. The TFT has a gate insulating film formed on part of the oxide semiconductor and a gate electrode formed on the gate insulating film. A portion of the oxide semiconductor that is covered with the gate electrode 104 and a portion of the oxide semiconductor that is not covered with the gate electrode are both covered with a first interlayer insulating film. The first interlayer insulating film is covered with a first film 106, and the first film is covered with a first AlO film.

4 Claims, 17 Drawing Sheets

(51) Int. Cl.
*H01L 29/45* (2006.01)
*H01L 29/49* (2006.01)

(52) U.S. Cl.
CPC ........ *H01L 29/42384* (2013.01); *H01L 29/45* (2013.01); *H01L 29/4908* (2013.01)

(56) References Cited

U.S. PATENT DOCUMENTS

| | | | |
|---|---|---|---|
| 9,240,488 B2* | 1/2016 | Yamazaki | H01L 29/7869 |
| 9,291,870 B2* | 3/2016 | Shin | H01L 29/41733 |
| 9,893,193 B2* | 2/2018 | Kanegae | H01L 29/78618 |
| 10,050,150 B2* | 8/2018 | Kobayashi | H01L 29/78693 |
| 11,063,154 B2* | 7/2021 | Yamaguchi | H01L 29/7869 |
| 11,742,430 B2* | 8/2023 | Yamaguchi | H01L 29/401 |
| | | | 257/43 |
| 2011/0147738 A1* | 6/2011 | Yamazaki | H01L 21/425 |
| | | | 257/43 |
| 2011/0233617 A1* | 9/2011 | Or-Bach | H01L 27/0688 |
| | | | 257/202 |
| 2011/0240998 A1* | 10/2011 | Morosawa | H01L 29/78618 |
| | | | 257/E29.273 |
| 2012/0248433 A1* | 10/2012 | Nakano | H01L 29/42384 |
| | | | 257/E29.296 |
| 2013/0181214 A1* | 7/2013 | Yamazaki | H01L 29/78696 |
| | | | 257/43 |
| 2014/0042434 A1* | 2/2014 | Yamazaki | H01L 29/78696 |
| | | | 257/43 |
| 2014/0167040 A1* | 6/2014 | Lee | H01L 29/66969 |
| | | | 257/43 |
| 2014/0284594 A1* | 9/2014 | Nakano | H01L 27/124 |
| | | | 257/43 |
| 2015/0123099 A1* | 5/2015 | Shin | G02F 1/136213 |
| | | | 257/66 |
| 2016/0163868 A1* | 6/2016 | Kobayashi | H01L 29/78693 |
| | | | 257/43 |
| 2016/0163878 A1* | 6/2016 | Kanegae | H01L 29/66969 |
| | | | 257/43 |
| 2017/0250289 A1* | 8/2017 | Sugawara | H01L 21/02233 |
| 2017/0278974 A1* | 9/2017 | Yoshitani | H01L 29/518 |
| 2018/0286890 A1* | 10/2018 | Suzumura | H01L 27/127 |

* cited by examiner

TFT CIRCUIT BOARD AND DISPLAY DEVICE HAVING THE SAME

CROSS-REFERENCE TO RELATED APPLICATIONS

This application is a continuation of U.S. patent application Ser. No. 17/347,630 filed on Jun. 15, 2021, which, in turn, is a continuation of U.S. patent application Ser. No. 15/649,126 (now U.S. Pat. No. 11,063,154) filed on Jul. 13, 2017. Further, this application claims priority from Japanese Patent Application JP 2016-141228 filed on Jul. 19, 2016, the entire contents of which are hereby incorporated by reference into this application.

BACKGROUND OF THE INVENTION

1. Field of the Invention

The present invention relates to thin film transistors (TFTs) that include an oxide semiconductor and display devices having such TFTs.

2. Description of the Related Art

TFTs that include an oxide semiconductor are low in leakage current. Thus, by using such TFTs in a display device, intermittent operation and reduction of power consumption become feasible.

On the other hand, it is necessary to prevent moisture or the like from reaching the oxide semiconductor by providing a barrier film because the properties of the oxide semiconductor are subject to change under the influence of moisture. Aluminum oxide (AlO) is used as a barrier film in the fields of optics and electronics because it has excellent barrier properties and is transparent.

The properties of AlO are prone to change depending on manufacturing conditions. According to Journal of Vacuum Science and Technology, A 12 (2), March/April 1994, the density of an AlO film gets larger as its refractive index becomes larger.

It should be noted that the chemical notations "AB" (e.g., SiO) and "CDEF" (e.g., IGZO=InGaZnO) used herein refer respectively to a chemical compound whose constituent elements are A and B and a chemical compound whose constituent elements are C, D, E, and F. The former notation does not refer to a chemical compound in which A and B are equal in composition ratio, and the latter notation does not refer to a chemical compound in which C, D, E, and F are equal in composition ratio. Although such a chemical compound has a basic composition ratio, it often deviates from the basic ratio depending on manufacturing conditions.

SUMMARY OF THE INVENTION

As the protective film for a TFT, a laminated film, such as those including a silicon oxide (SiO) film, a silicon nitride (SiN) film, an organic passivation film, or the like, is used. When an oxide semiconductor is to be used in a TFT, it is effective to use AlO as a blocking film for moisture and hydrogen since the properties of the oxide semiconductor will be affected by such molecules.

On the other hand, in order to connect the source or drain of the TFT to a signal wire or a pixel electrode, it is also necessary to form a through-hole in the protective film or an insulating film. Because different etch conditions are used for AlO, SiO, SiN, and so on, such through-holes need to be formed in multiple steps.

If a through-hole is formed in multiple steps, it becomes difficult to control the depth of the through-hole. Moreover, the through-hole may penetrate the drain or source formed of the oxide semiconductor, each of which acts as a connecting point. This will render the TFT inoperable. In addition, if an electrode for which an electrical connection needs to be made (e.g., a gate electrode, drain electrode, or source electrode) has a layered structure formed of Al alloy and capping metal that acts a connecting point, the through-hole formed may penetrate the capping metal due to over-etching. In such a case, the contact resistance at the connecting point becomes stable.

An object of the invention is thus to provide a circuit structure in which an oxide semiconductor TFT is protected by an AlO barrier film, the structure making it possible to prevent the drain, gate, and source from being destroyed or becoming operationally unstable by over-etching during the formation of through-holes.

The invention is designed to achieve the above object and can be implemented as the following means.

(1) A TFT circuit board having thereon a TFT that includes an oxide semiconductor, in which: the TFT has a gate insulating film formed on the oxide semiconductor and a gate electrode formed on the gate insulating film; and a portion of the oxide semiconductor that is covered with the gate electrode and a portion of the oxide semiconductor that is not covered with the gate electrode are covered with a first interlayer insulating film, the first interlayer insulating film being covered with a first film, the first film being covered with a first AlO film.

(2) The TFT circuit board recited in (1), in which the gate insulating film is formed on part of a surface of the oxide semiconductor that faces the gate electrode.

(3) The TFT circuit board recited in (2), in which: the portion of the oxide semiconductor that is not covered with the gate electrode includes a first portion and a second portion, the first portion acting as a drain, the second portion acting as a source; through-holes are formed in the first interlayer insulating film, the first film, and the first AlO film that cover the drain and the source, the through-holes being connected to the drain and source; and the drain is connected to a drain wire via one of the through-holes and the source is connected to a source wire via other of the through-holes.

(4) A TFT circuit board having thereon a TFT that includes an oxide semiconductor, in which: the TFT has a gate insulating film formed on a gate electrode and the oxide semiconductor formed on the gate insulating film, one side of the oxide semiconductor being connected to a drain electrode, other side of the oxide semiconductor being connected to a source electrode; and a first interlayer insulating film is formed so as to cover the oxide semiconductor, the drain electrode, and the source electrode, the first interlayer insulating film being covered with a first film, the first film being covered with a first AlO film.

(5) The TFT circuit board recited in (4), in which: through-holes are formed in the first interlayer insulating film, the first film, and the first AlO film that cover the drain electrode or the source electrode, the through-holes being connected to the source electrode and the drain electrode; and the drain electrode is connected to a drain wire via one of the through-holes and the source electrode is connected to a source wire via other of the through-holes.

DESCRIPTION OF THE PREFERRED EMBODIMENTS

Embodiments of the present invention will now be described in detail.

Figure 1:
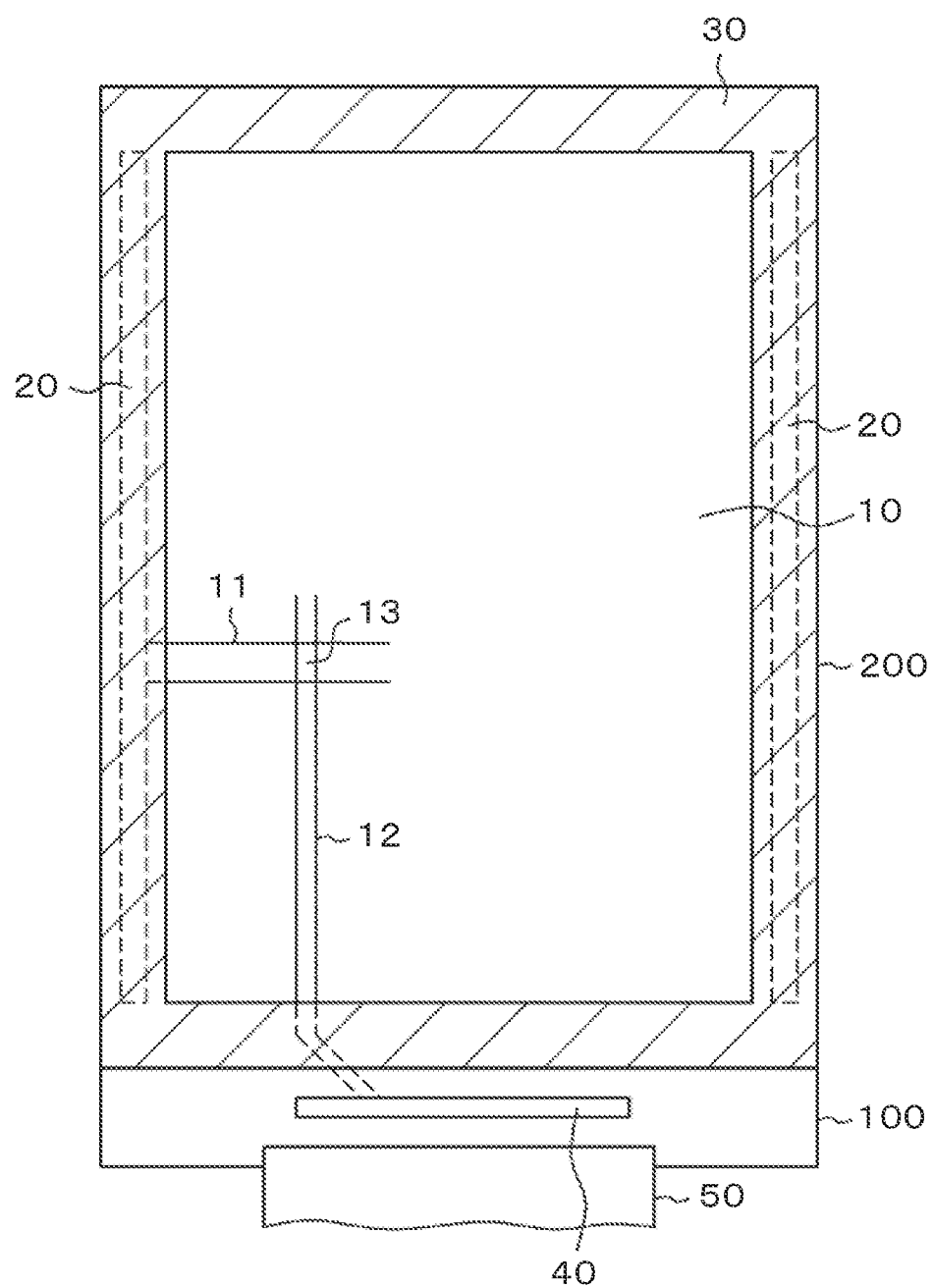
FIG. 1 is a plan view of a liquid crystal display device.

TFTs are widely used in display devices such as liquid crystal display devices and organic electroluminescence (EL) display devices. FIG. 1 is a plan view of a liquid crystal display device. In FIG. 1, a TFT substrate 100 and a counter substrate 200 are glued together via a sealing material 30 at the periphery of the TFT substrate 100, and the enclosed space is filled with liquid crystals. The area within the sealing material 30 acts as a display area 10. In the display area 10, scan lines 11 extend in a horizontal direction and are arranged in a vertical direction while video signal lines 12 extend in the vertical direction and are arranged in the horizontal direction. Each area enclosed by two scan lines 11 and two video signal lines 12 acts as a pixel 13. In the terminal section where the TFT substrate 100 and the counter substrate 200 do not face each other, a driver IC is mounted. Connected to the driver IC 40 is a flexible wiring substrate 50.

Scan line drive circuits 20, formed of TFTs, are located below the sealing material 30. Also, a switching TFT is formed in each pixel. Thus, it follows that the liquid crystal display device includes a great number of TFTs, and the present invention is applied to display structures in which the TFTs are formed of oxide semiconductors.

The invention is also applicable to cases where some, not all, of the TFTs are formed of oxide semiconductors. The invention is further applicable to cases where TFT circuits other than the scan line drive circuits 20 are formed of oxide semiconductors. In addition, although FIG. 1 illustrates a liquid crystal display device as an example, the invention is also applicable to organic EL display devices, in which pixels and drive circuits can be formed using oxide semiconductors.

Figure 2:
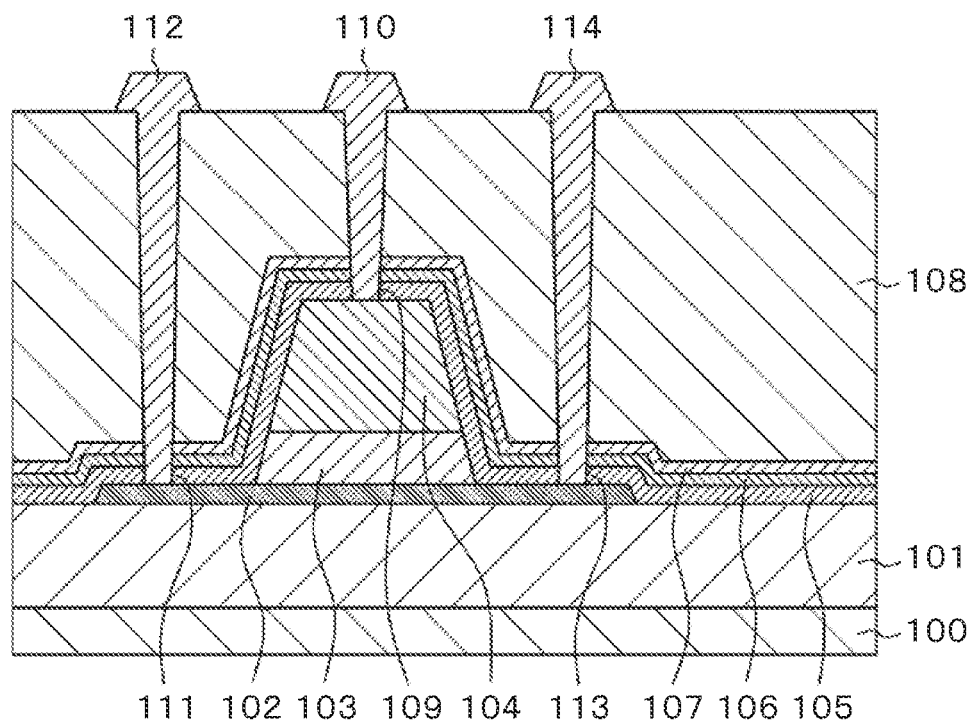
FIG. 2 is a cross section of a TFT according to Embodiment 1 of the invention.

FIG. 2 is a cross section of an oxide semiconductor TFT according to the invention and its nearby area. As illustrated in FIG. 2, an undercoat film 101 is formed on a glass-made TFT substrate 100, and an oxide semiconductor 102 is formed on the undercoat film 101. The undercoat film 101 is often formed of multiple films such as an SiN film and an SiO film. Examples of oxide semiconductors include indium gallium zinc oxide (IGZO), indium tin zinc oxide (ITZO), zinc oxide nitride (ZnON), and indium gallium oxide (IGO), but we assume herein that the oxide semiconductor 102 is IGZO.

A gate insulating film 103 is formed on the oxide semiconductor 102, and a gate electrode 104 is formed on the gate insulating film 103. The gate insulating film 103 is formed of SiO and located only between the oxide semiconductor 102 and the gate electrode 104. The gate electrode 104 is formed of an Al alloy for the purpose of reducing its electrical resistance and sandwiched between a base metal and a capping metal.

Figure 3:
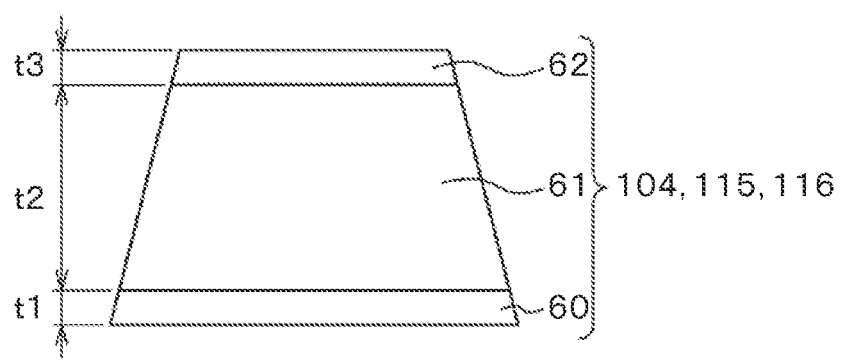
FIG. 3 is a cross section of a gate electrode, drain electrode, and source electrode.

FIG. 3 is a cross section of the gate electrode 104. As illustrated in FIG. 3, an aluminum (Al) alloy 61 (e.g., aluminum-silicon (AlSi)) is sandwiched between a base metal 60, formed of titanium (Ti), and a capping metal 62, also formed of Ti. The base metal 60 and the capping metal 62 are used to prevent formation of a hillock from the AlSi and stabilize the contact resistance between the AlSi and a wire in a through-hole. It should be noted that the Al alloy 61 can instead be other types of Al alloy such as aluminum-copper (AlCu). Also, the base metal 60 and the capping metal 62 can be metals of high melting points such as cromium (Cr), molybdenum (Mo), and tungsten (W). In FIG. 3, the thickness t2 of the Al alloy 61 is, for example, 300 nm, the thickness t1 of the base metal 60 being, for example, 50 nm, the thickness of the capping metal 62 being, for example, 50 nm.

Referring back to FIG. 2, a first interlayer insulating film 105, made of SiO, is formed to cover the TFT. The first interlayer insulating film 105 acts on the oxide semiconductor 102 to impart electrical conductivity to the oxide semiconductor 102. As a result, the drain and the source are formed at the portions where the oxide semiconductor 102 is in contact with the first interlayer insulating film 105. The first interlayer insulating film 105 is 100 to 500 nm thick. It should be noted that the SiO that constitutes the gate insulating film 103 and the SiO that constitutes the first interlayer insulating film 105 have different properties.

Formed on the first interlayer insulating film 105 is a cured film 106, which constitutes a main feature of the invention. The cured film 106 acts as an etching stopper at the time of performing dry etching on an AlO film 107. The thickness of the cured film 106 is, for example, 10 to 100 nm. Examples of the material of the cured film 106 include SiO formed from tetraethyl orthosilicate (TEOS), high-density SiO formed by chemical vapor deposition (CVD) at a temperature of 400 degrees Celsius or higher, high-density SiN formed by CVD at a temperature of 400 degrees Celsius or higher, indium tin oxide (ITO), IGZO, titanium nitride (TiN), titanium oxide (TiO), amorphous silicon (a-Si), SiC, amorphous carbon (a-C), and carbon nitride (CN).

Formed on the cured film 106 is the AlO film 107, which acts as a barrier film. The AlO film 107 protects the oxide semiconductor 102 from the moisture or hydrogen entering from above. The AlO film 107 is, for example, 10 to 100 nm thick and formed by sputtering or atomic layer deposition (ALD).

After the formation of the AlO film 107, dry etching is performed to form through-holes in the AlO film 107, the cured film 106, and the first interlayer insulating film 105 so that wire connection can be made between the drain of the TFT and a drain wire, between the source of the TFT and a source wire, or between the gate electrode and a gate wire. The formation of those through-holes is done by two-stage dry etching, which will be described later.

After the formation of the thorough-holes, a planarizing film 108, made of an organic material, is formed to cover the AlO film 107. Because the planarizing film 108 is formed of a photosensitive resin such as polyimide and acrylic resin, through-holes can be formed in the planarizing film 108 without a resist. In FIG. 2, the through-holes formed in the planarizing film 108 and those formed in the AlO film 107 and the like are depicted as continuous holes for simplification purposes, but, in fact, they differ in terms of forming process and diameter. It should be noted that the planarizing film 108 can be formed of an inorganic material such as SiO and SiN in place of an organic material.

In this specification, we use the term "gate through-hole 109" to refer to the through-hole that connects to the gate electrode 104 of the TFT, "drain through-hole 111" to refer to the through-hole that connects to the drain, and "source through-hole 113" to refer to the through-hole that connects to the source. A gate wire 110 is formed in the gate through-hole 109, and a drain wire 112 is formed in the drain through-hole 111. Also, a source wire 114 is formed in the source through-hole 113.

Figure 4:
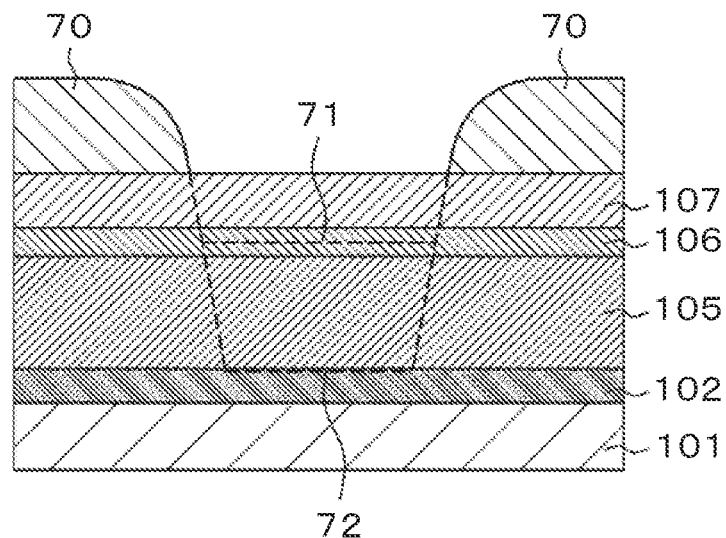
FIG. 4 is a cross section illustrating the process of forming a through-hole according to the invention.

FIG. 4 is a cross section illustrating the process of forming the drain through-hole 111 according to the invention. As illustrated in FIG. 4, a resist 70 is first applied onto the AlO film 107 except the through-hole forming area. The AlO film 107 is then etched away by dry etching using a chlorine-based gas ($Cl_2$). Because the cured film 106 is not etched by the chlorine-based gas ($Cl_2$) dry etching, the etching is stopped at the cured film 106, thus allowing only the AlO film 107 to be etched away. This state is illustrated by the dotted line 71. Thereafter, the cured film 106 and the first interlayer insulating film 105 are etched away by dry etching using a fluorine-based gas, thereby forming the drain through-hole 111. This state is illustrated by the dotted line 72. The same process is also used to form the source through-hole 113.

Alternatively, the cured film 106 can be etched by wet etching, and the first interlayer insulating film 105 can then be etched by the above method. In that case, the cured film 106 can be formed of ITO, IGZO, or the like.

It should be noted that, in the present embodiment, the portions of the oxide semiconductor 102 where the drain through-hole 111 and the source through-hole 113 are present are not covered with the gate insulating film 103. However, the invention is also applicable to the structure in which those portions of the oxide semiconductor 102 are covered with the gate insulating film 103. In that case, additional etching needs to be performed on the gate insulating film 103 at the drain and source portions in order to form through-holes.

Figure 5:
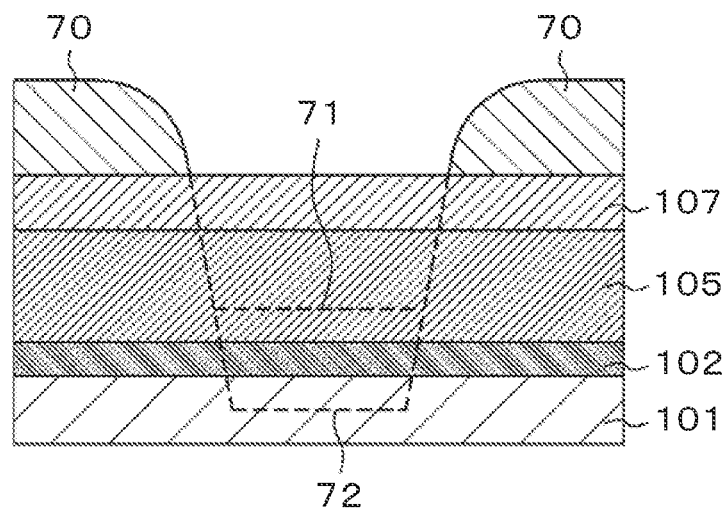
FIG. 5 is a cross section illustrating the process of forming a through-hole when the invention is not applied.

FIG. 5 is a cross section illustrating the process of forming the drain through-hole 111 when the invention is not applied, that is, when the cured film 106 is not present. As illustrated in FIG. 5, the AlO film 107 is first etched away by dry etching using a chlorine-based gas to form the through-hole. However, in the chlorine-based gas dry etching, the selectivity ratios of the AlO film 107 and first interlayer insulating film 105 are low. Thus, the SiO that constitutes the first interlayer insulating film 105 is also etched to some extent by the chlorine-based gas dry etching, which means that the through-hole formed penetrates the AlO film 107 and extends into the first interlayer insulating film 105. This state is illustrated by the dotted line 71 in FIG. 5. It should be noted that because the chlorine-based gas dry etching is not intended to etch the first interlayer insulating film 105, we cannot predict exactly how much the first interlayer insulating film 105 will be etched away.

If the first interlayer insulating film 105 is then etched by dry etching using a fluorine-based gas, the oxide semiconductor 102 that constitutes the drain will also be etched. This state is illustrated by the dotted line 72. FIG. 5 further shows that part of the undercoat film 101 will also be etched away. Thus, even if the through-hole 111 is formed, an electrical connection will not be established for the drain of the TFT. The same explanation applies to the source through-hole 113.

Figure 6:
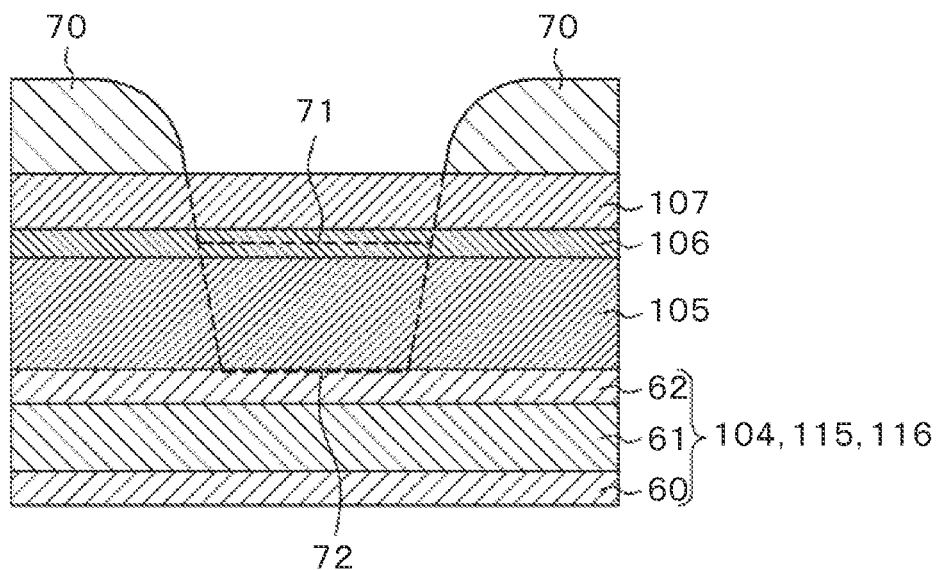
FIG. 6 is a cross section illustrating the process of forming a through-hole to be connected to a gate electrode, drain electrode, or source electrode according to the invention.

FIG. 6 is a cross section illustrating the process of forming the gate through-hole 109. As already described with reference to FIG. 3, the gate electrode 104 has a three-layered structure. That is, the Al alloy 61 is formed on the base metal 60 made of Ti, and the capping metal 62 made of Ti is formed on the Al alloy 61. The capping metal 62 is intended to be connected to the gate wire 110.

The insulating film covering the gate electrode 104 is the same as that covering the drain and source. Thus, the same through-hole forming process as that described with reference to FIG. 4 is used. As illustrated in FIG. 6, the resist 70 is first applied onto the AlO film 107 except the through-hole forming area. The AlO film 107 is then etched away by dry etching using a chlorine-based gas ($Cl_2$). Because the cured film 106 is not etched by the chlorine-based gas ($Cl_2$) dry etching, the etching is stopped at the cured film 106, thus allowing only the AlO film 107 to be etched away. This state is illustrated by the dotted line 71. Thereafter, the cured film 106 and the first interlayer insulating film 105 are etched away by dry etching using a fluorine-based gas, thereby forming the gate through-hole 109. This state is illustrated by the dotted line 72.

Figure 7:
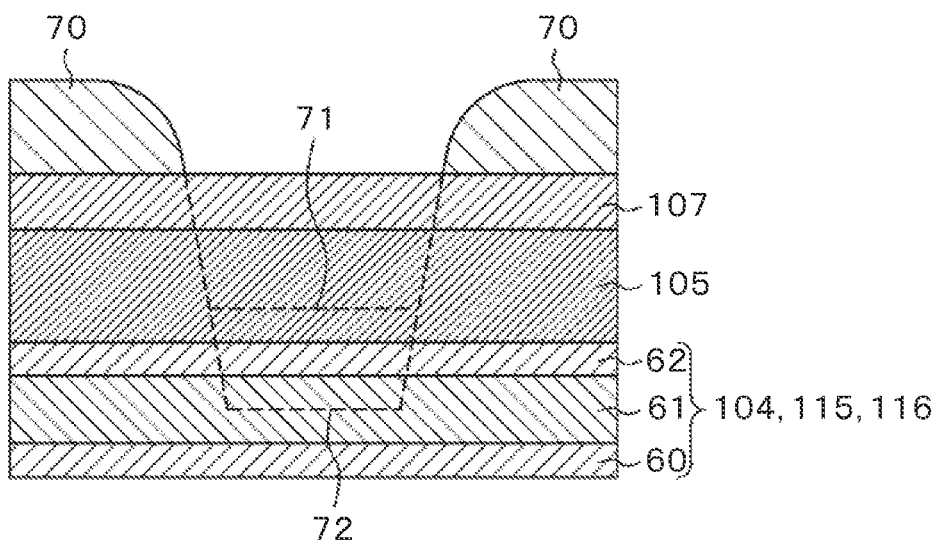
FIG. 7 is a cross section illustrating the process of forming a through-hole to be connected to a gate electrode, drain electrode, or source electrode according to a comparative example.

FIG. 7 is a cross section illustrating the process of forming the gate through-hole 109 when the invention is not applied, that is, when the cured film 106 is not present. As illustrated in FIG. 7, the AlO film 107 is first etched away by dry etching using a chlorine-based gas to form the through-hole. However, in the chlorine-based gas dry etching, the selectivity ratios of the AlO film 107 and first interlayer insulating film 105 are low. Thus, the SiO that constitutes the first interlayer insulating film 105 is also etched to some extent by the chlorine-based gas dry etching, which means that the through-hole formed penetrates the AlO film 107 and extends into the first interlayer insulating film 105. This state is illustrated by the dotted line 71 in FIG. 7. It should be noted that because the chlorine-based gas dry etching is not intended to etch the first interlayer insulating film 105, we cannot predict exactly how much the first interlayer insulating film 105 will be etched away.

If the first interlayer insulating film 105 is then etched by dry etching using a fluorine-based gas, the capping metal 62 and part of the Al alloy 61 will also be etched away. This state is illustrated by the dotted line 72. If the gate wire 110 is connected to the gate through-hole 109 thus formed, the gate wire 110 will be in direct contact with the Al alloy 61, which destabilizes the contact resistance at the gate through-hole 109. If the thickness of the capping metal 62 is increased to avoid this, the process load will in turn increase.

Figure 8:
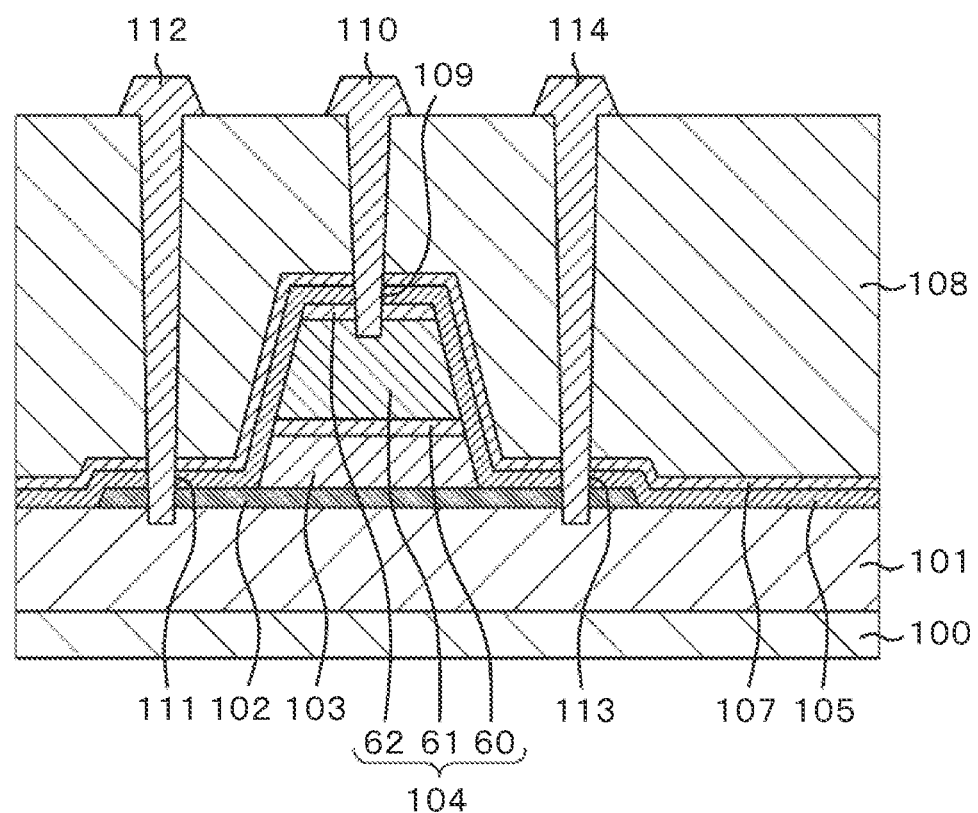
FIG. 8 is a cross section of a TFT when the invention is not applied.

FIG. 8 is a cross section of a TFT and its nearby area according to a comparative example in which the invention is not applied, that is, the cured film 106 is not present underneath the AlO film 107. As illustrated in FIG. 8, in the drain section, the drain through-hole 111 penetrates the oxide semiconductor 102 and extends into the undercoat film 101. Thus, even if the drain wire 112 is formed in the drain through-hole 111, it cannot be connected to the TFT. The same phenomenon will occur in the source through-hole 113, making it impossible to connect the source wire 114 and the TFT.

As further illustrated in FIG. 8, in the section of the gate electrode 104, the gate through-hole 109 penetrates the capping metal 62 and extends into the Al alloy 61. Thus, the gate wire 110 is connected mainly to the Al alloy 61. As a result, the contact resistance at the gate through-hole 109 will become unstable.

In contrast, according to the invention, the cured film 106, which acts as an etching stopper, is formed underneath the AlO film 107 as illustrated in FIG. 2. This allows precise control of etching areas at the time of dry etching, which in turn stabilizes the operation of the TFT.

Figure 9:
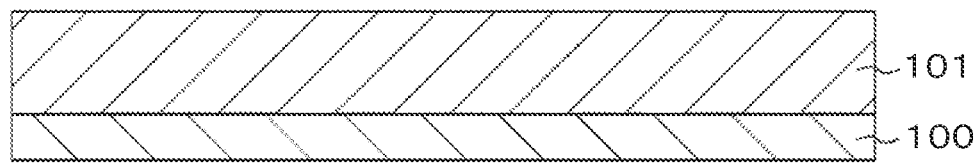
FIG. 9 is a cross section illustrating an undercoat film formed on a glass substrate.

FIGS. 9 through 13 are cross sections illustrating the process of forming the TFT according to the invention. In FIG. 9, the undercoat film 101 is formed on the glass-made TFT substrate 100 by CVD. The undercoat film 101 often includes multiple films, such as SiO and SiN, which can be formed successively by CVD. The undercoat film 101 is used to block the movement of impurities from the glass substrate 100.

Figure 10:
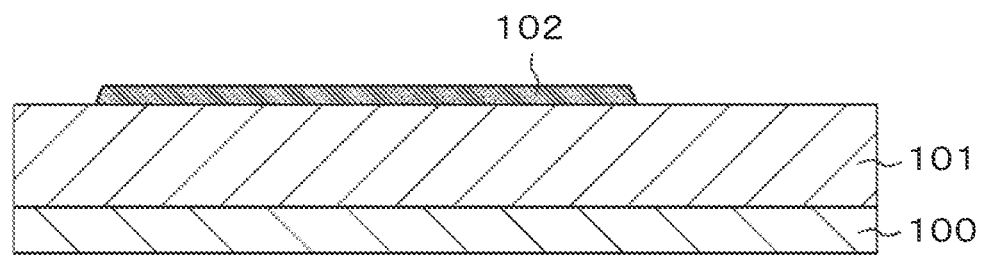
FIG. 10 is a cross section illustrating a patterned oxide semiconductor.
Figure 11:
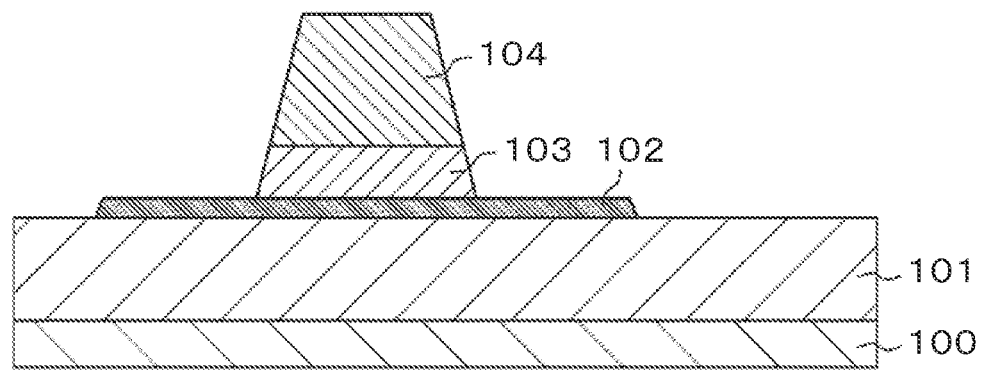
FIG. 11 is a cross section illustrating the formation of a gate insulating film and a gate electrode.

FIG. 10 is a cross section in which the oxide semiconductor 102 is sputtered onto the undercoat film 101 and then patterned into an island shape. As already described, various materials can be used to form the oxide semiconductor 102, but we assume here that the oxide semiconductor 102 is IGZO.

SiO is then used to form the gate insulating film 103 on the oxide semiconductor 102. The gate electrode 104 is then formed on the gate insulating film 103. Thereafter, as illustrate in FIG. 11, the gate electrode 104 and the gate insulating film 103 are patterned simultaneously by dry etching. The gate insulating film 103 is present only below the gate electrode 104.

Figure 12:
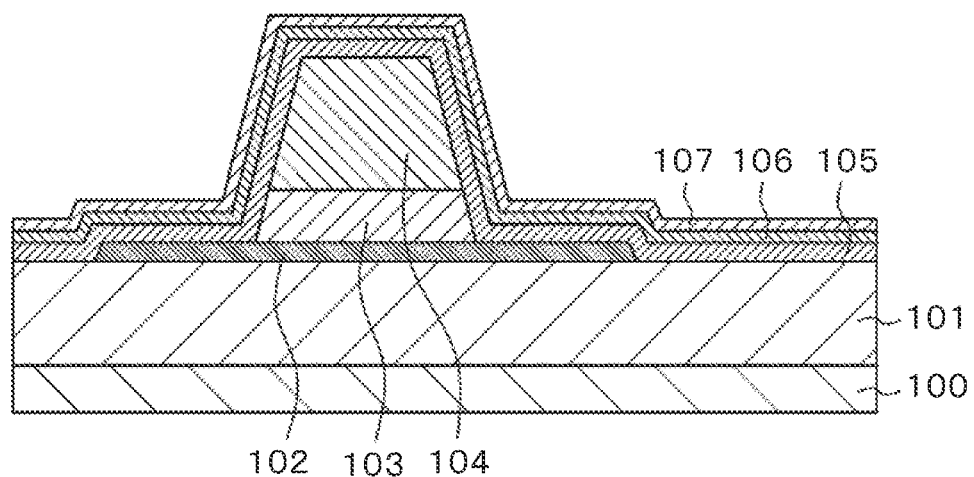
FIG. 12 is a cross section illustrating the formation of a first interlayer insulating film, a cured film, and an AlO barrier film.

Thereafter, as illustrated in FIG. 12, SiO is deposited to form the first interlayer insulating film 105 such that the film 105 covers the oxide semiconductor 102, the gate electrode 104, and so forth. The cured film 106 is then formed on the first interlayer insulating film 105, and the AlO film 107, which acts as a barrier film, is formed on the cured film 106. The SiO that constitutes the first interlayer insulating film 105 and the SiO that constitutes the gate insulating film 103 have different properties. The former SiO acts on the oxide semiconductor 102 to impart electrical conductivity to the oxide semiconductor 102. As a result, the drain and the source can be formed at the portions of the oxide semiconductor 102 on which the gate insulating film 103 is not present.

Figure 13:
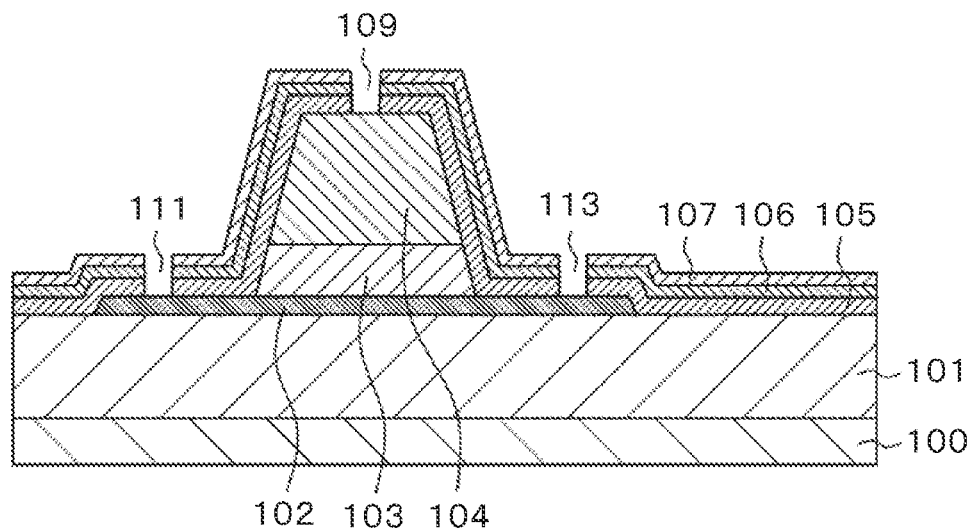
FIG. 13 is a cross section illustrating through-holes formed in the first interlayer insulating film, the cured film, and the barrier film.

Thereafter, as illustrated in FIG. 13, the gate through-hole 109, the drain through-hole 111, and the source through-hole 113 are formed. These through-holes are first formed in the AlO film 107 by dry etching using a chlorine-based gas. The cured film 106 acts as an etching stopper to stop the chlorine-based gas dry etching. The cured film 106 and the first interlayer insulating film 105 are then etched by dry etching using a fluorine-based gas to further the formation of the through-holes. The drain through-hole 111, the source through-hole 113, and the gate through-hole 109 are formed simultaneously.

As already described, the cured film 106, which constitutes a main feature of the invention, can be SiO formed from TEOS, high-density SiO formed by CVD at a high temperature, high-density SiN, or the like. Importantly, it is necessary that the cured film 106 not be etched by chlorine-based gas dry etching but etched by fluorine-based gas dry etching. In other words, the cured film 106 must not be etched under the etch conditions for the AlO film 107, but needs to be etched under the etch conditions for the SiO that constitutes the first interlayer insulating film 105.

Thereafter, the planarizing film is formed using an organic material or the like, and the through-holes are formed also in the planarizing film. The gate wire, the drain wire, and the source wire are then formed, resulting in the structure of FIG. 2. As described above, the invention therefore allows precise control of the depth of the through-holes by forming the cured film 106 underneath the AlO film 107. Thus, oxide semiconductor TFTs having stable properties can be fabricated.

Figure 14:
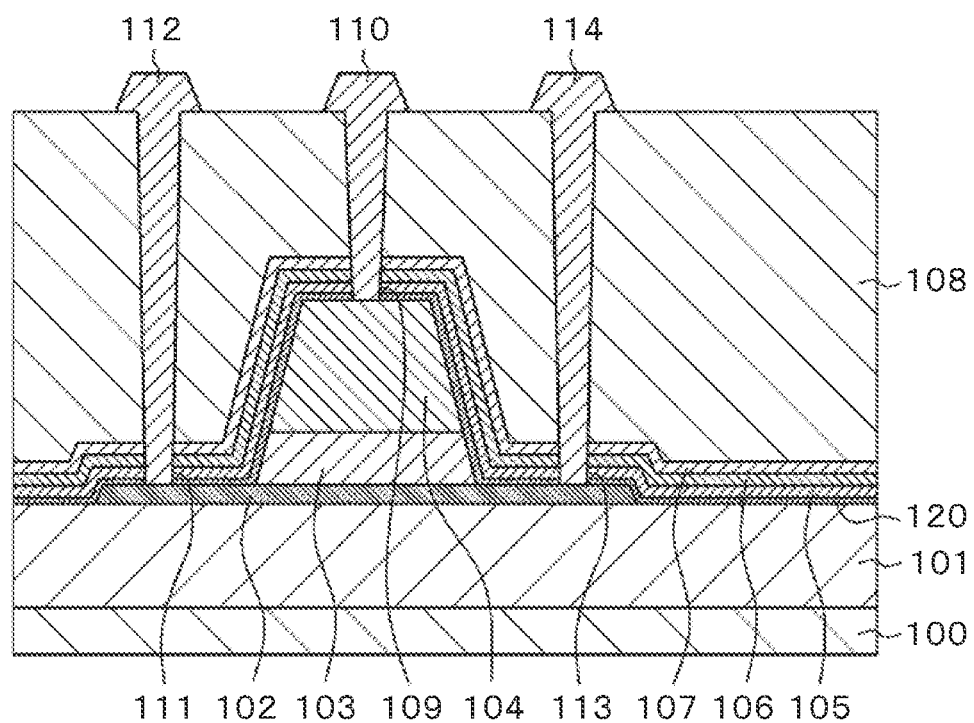
FIG. 14 is a cross section illustrating another form of Embodiment 1.

FIG. 14 is a cross section of a TFT and its nearby area according to another form of the present embodiment. FIG. 14 differs from FIG. 2 in that, in the former, a second AlO film 120 is formed between the first interlayer insulating film 105 and the oxide semiconductor 102. The second AlO film 120 is thinner than the first AlO film 107, which serves as a barrier film, and has a thickness of 5 to nm. In the case where electrical conductivity is imparted to the oxide semiconductor 102 by the interaction between the first interlayer insulating film 105 and the oxide semiconductor 102 to form the drain and source, the resistances of the drain and source may increase over time. Such a phenomenon can be prevented by forming the thinner second AlO film 120 between the first interlayer insulating film 105 and the oxide semiconductor 102.

In terms of forming the drain through-hole 111, the source through-hole 113, the gate through-hole 109, and the like, the same process as that described with reference to FIGS. 4 and 6 can be used. In fluorine-based gas dry etching, the selectivity ratios of the first interlayer insulating film 105 and second AlO film 120 are not high. Thus, the thinner second AlO film 120 can be etched away by fluorine-based or chlorine-based gas dry etching. As a result, each through-hole can be formed in a stable manner as illustrated in FIG. 14.

Figure 15:
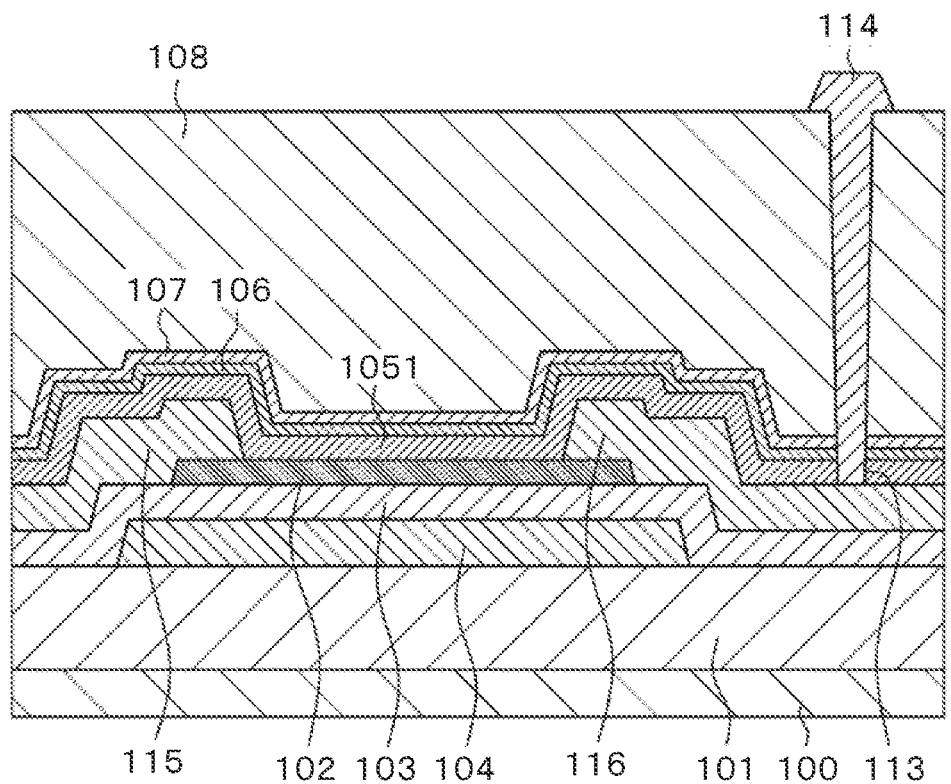
FIG. 15 is a cross section of a TFT according to Embodiment 2.

FIG. 15 is a cross section of a TFT according to Embodiment 2 of the invention. In FIG. 15, the invention is applied to a TFT of the bottom-gate type. As illustrated in FIG. 15, the undercoat film 101 is formed on the glass-made TFT substrate 100. The undercoat film 101 is the same as that used in Embodiment 1. The gate electrode 104 is formed on the undercoat film 101. The gate electrode 104 has a three-layered structure as in FIG. 3. The gate insulating film 103, made of SiO, is formed to cover the gate electrode 104.

The oxide semiconductor 102 is formed on the gate insulating film 103, thereby forming a TFT. A drain electrode 115 is formed on one side of the oxide semiconductor 102 while a source electrode 116 is formed on the other side of the oxide semiconductor 102. The drain electrode 115 and the source electrode 116 also have a three-layered structure as in FIG. 3: the base metal 60, the Al alloy 61, and the capping metal 62. This is to reduce their electric resistances.

A third interlayer insulating film 1051 is formed to cover the oxide semiconductor 102, the drain electrode 115, the source electrode 116, and the like. The third interlayer insulating film 1051 is formed of SiO, but it differs from the first interlayer insulating film 105 illustrated in FIG. 2. The third interlayer insulating film 1051 does not react with nor impart electrical conductivity to the oxide semiconductor 102. However, the third interlayer insulating film 1051 has a thickness of 100 to 500 nm, as is similar to the first interlayer insulating film 105 of Embodiment 1.

The cured film 106, which constitutes a main feature of the invention, is formed to cover the third interlayer insulating film 1051. Similar to Embodiment 1, the cured film 106 has a thickness of 10 to 100 nm. The AlO film 107, which is a 10 to 100 nm thick barrier film, is formed to cover the cured film 106. Thereafter, to connect the source electrode 116 and the source wire 114, a through-hole 113 is formed in the AlO film 107 as a barrier film, the cured film 106, and the third interlayer insulating film 1051. Note that although only the source through-hole 113 is illustrated in FIG. 15, a drain through-hole is also fabricated in the same manner.

In Embodiment 2, the chlorine-based gas dry etching to etch the AlO film 107 is stopped at the cured film 106 as in FIG. 6. Fluorine-based gas dry etching is then performed to etch the cured film 106 and the third interlayer insulating film 1051. Thus, the depth of the through-hole 113 can be controlled precisely, which in turns allows a stable connection between the source electrode 116 and the source wire 114 as illustrated in FIG. 15. Thereafter, similar to Embodiment 1, an organic material or the like is used to form the planarizing film 108, and the through-hole is formed also in the planarizing film 108 to connect the source wire 114 and the source electrode 116.

Figure 16:
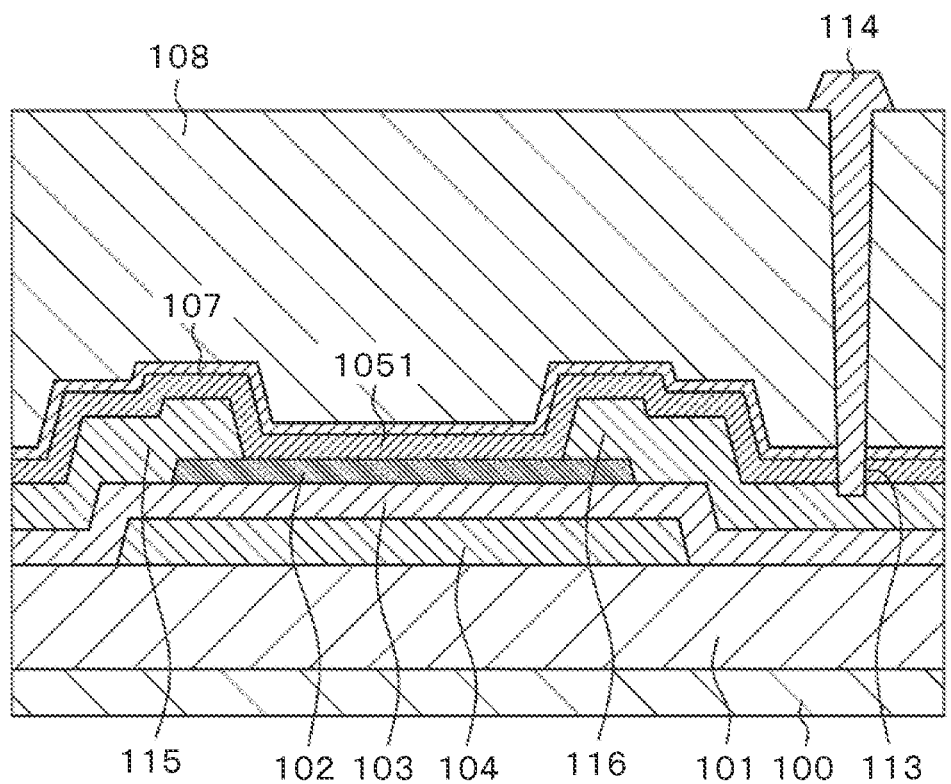
FIG. 16 is a cross section of a TFT when the invention is not applied.

FIG. 16 is a cross section of a TFT and its nearby area when the invention is not applied. Unlike FIG. 15, the cured film 106 is not present between the AlO film 107, or a barrier film, and the third interlayer insulating film 1051 in FIG. 16. In this case, it becomes difficult to control the depth of the through-hole 113 as in FIG. 7, and the through-hole will penetrate the capping metal 62 and extend into the Al alloy 61. As a result, the source wire 114 will be in direct contact with the Al alloy 61 of the source electrode 116, which destabilizes the contact resistance at the through-hole 113.

In contrast, according to Embodiment 2, the chlorine-based gas dry etching to etch the AlO film 107 is stopped at the cured film 106. Thus, the dimension in the depth direction of the through-hole 113 can be controlled precisely, and the contact resistance at the through-hole 113 can be stabilized as well. As a result, a bottom-gate type TFT using the oxide semiconductor 102 can be fabricated in a stable manner.

Figure 17:
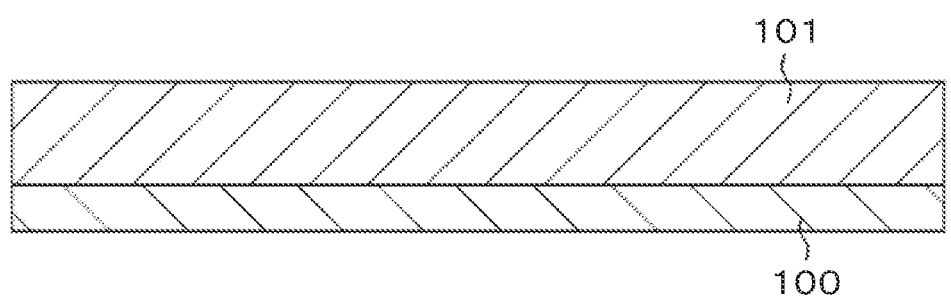
FIG. 17 is a cross section illustrating an undercoat film formed on a glass substrate.
Figure 18:
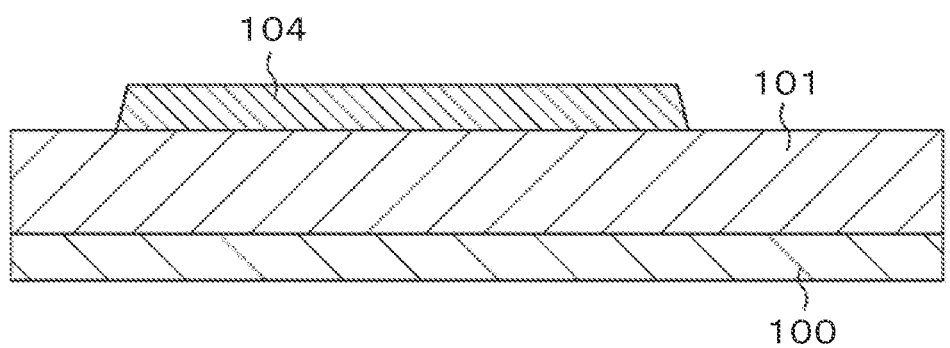
FIG. 18 is a cross section illustrating a gate electrode formed on the undercoat film.
Figure 19:
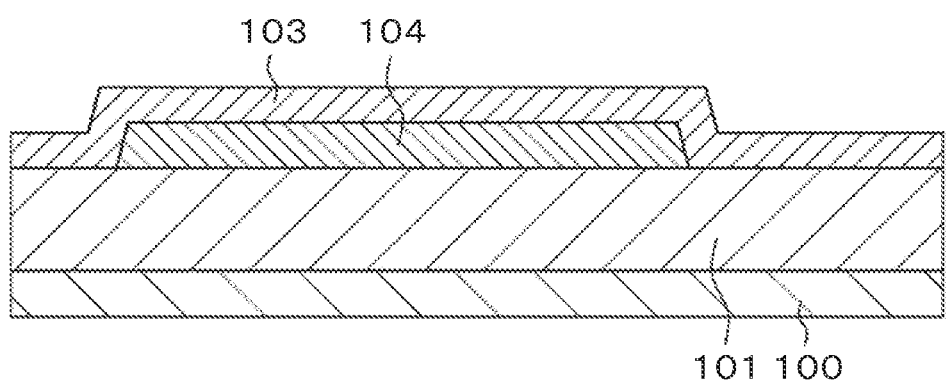
FIG. 19 is a cross section illustrating the formation of a gate insulating film.

FIGS. 17 through 23 are cross sections illustrating the process of forming the bottom-gate type TFT of Embodiment 2 illustrated in FIG. 15. In FIG. 17, the undercoat film 101 is formed on the glass-made TFT substrate 100. In FIG. 18, the gate electrode 104 is formed and patterned. In FIG. 19, SiO is deposited on the gate electrode 104 to form the gate insulating film 103.

Figure 20:
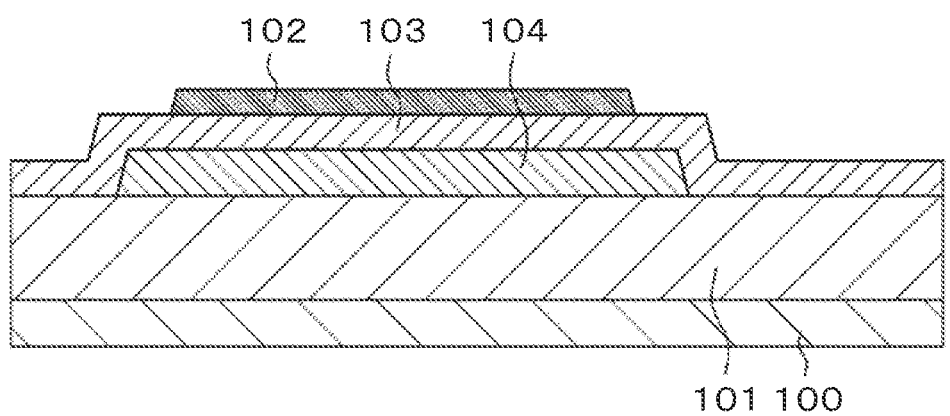
FIG. 20 is a cross section illustrating an oxide semiconductor patterned on the gate insulating film.
Figure 21:
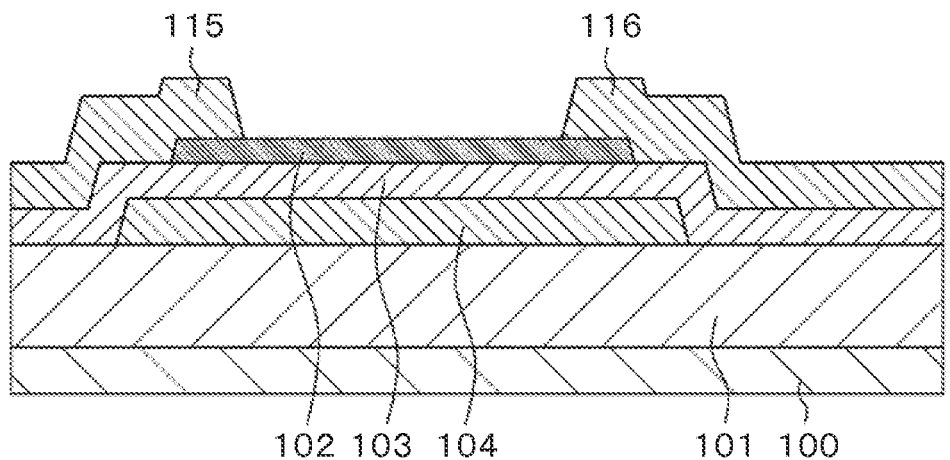
FIG. 21 is a cross section illustrating a drain electrode and a source electrode formed on the oxide semiconductor.

In FIG. 20, the oxide semiconductor 102 is formed on the gate insulating film 103 and patterned. In FIG. 21, the drain electrode 115 is formed on one side of the oxide semiconductor 102 while the source electrode 116 is formed on the other side of the oxide semiconductor 102. The drain electrode 115 and the source electrode 116 have a three-layered structure as in FIG. 3.

Figure 22:
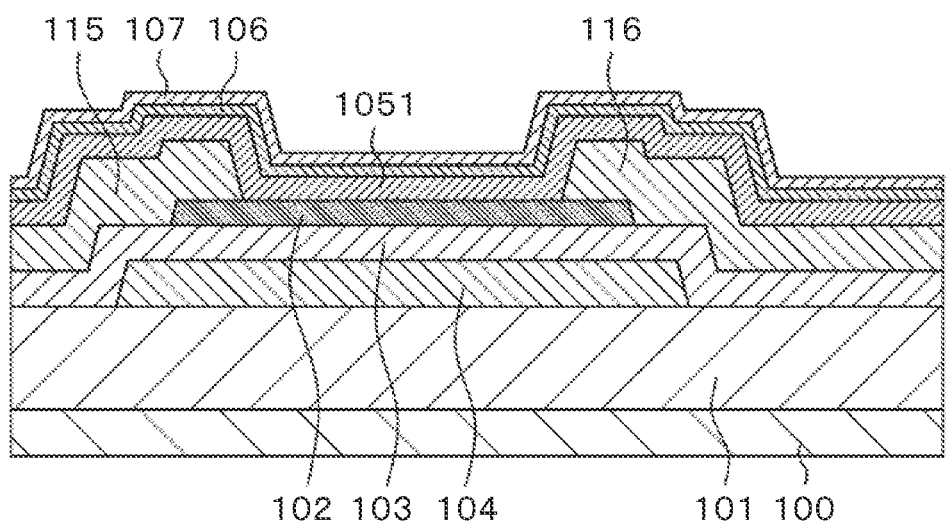
FIG. 22 is a cross section illustrating the formation of a third interlayer insulating film, a cured film, and an AlO barrier film to cover a TFT.
Figure 23:
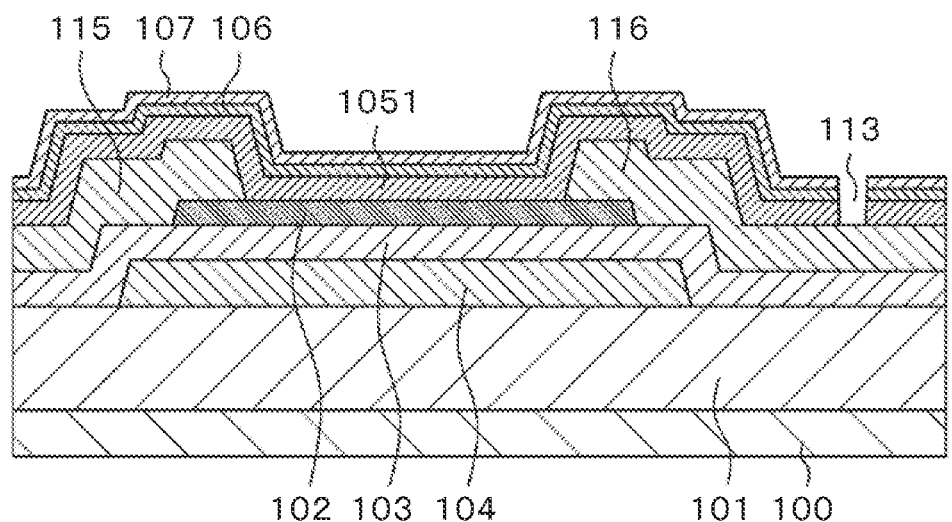
FIG. 23 is a cross section illustrating the formation of a through-hole in the third interlayer insulating film, cured film, and AlO barrier film according to the invention.

In FIG. 22, the third interlayer insulating film 1051, the cured film 106, and AlO film 107, a barrier film, are formed to cover the oxide semiconductor 102, the drain electrode 115, and the source electrode 116. In FIG. 23, on the side of the source electrode 116, the through-hole 113 is formed in the AlO film 107, the cured film 106, and the third interlayer insulating film 1051. As already described with reference to FIG. 6, Embodiment 2 also allows precise control of the depth of the through-hole 113 by forming the cured film 106, thereby ensuring a stable electrical connection at the through-hole 113. The same applies to the drain electrode side.

Figure 24:
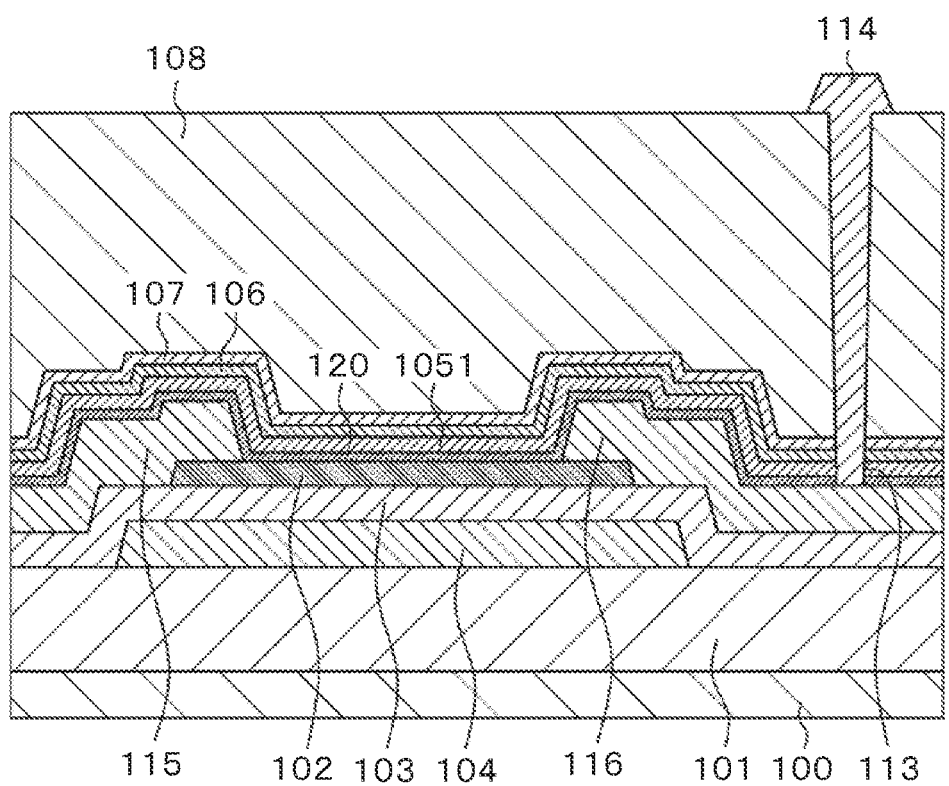
FIG. 24 is a cross section illustrating another form of Embodiment 2.

FIG. 24 is a cross section illustrating another form of Embodiment 2. FIG. 24 differs from FIG. 15 in that, in the former, the second AlO film 120 is formed between the third interlayer insulating film 1051 and the source electrode 116. The reason for forming the second AlO film 120 is the same as that described in Embodiment 1. In addition, similar to Embodiment 1, the presence of the second AlO film 120 will not increase the etch process load. Therefore, the same advantages as those of Embodiment 2 can also be obtained through the structure of FIG. 24.

TFTs formed of oxide semiconductors are low in leakage current, but they have a lower carrier mobility rate than TFTs formed of polycrystalline silicon (Poly-Si). Thus, it is efficient to use oxide semiconductor TFTs as the switching TFTs of pixels and Poly-Si TFTs as drive circuits.

Figure 25:
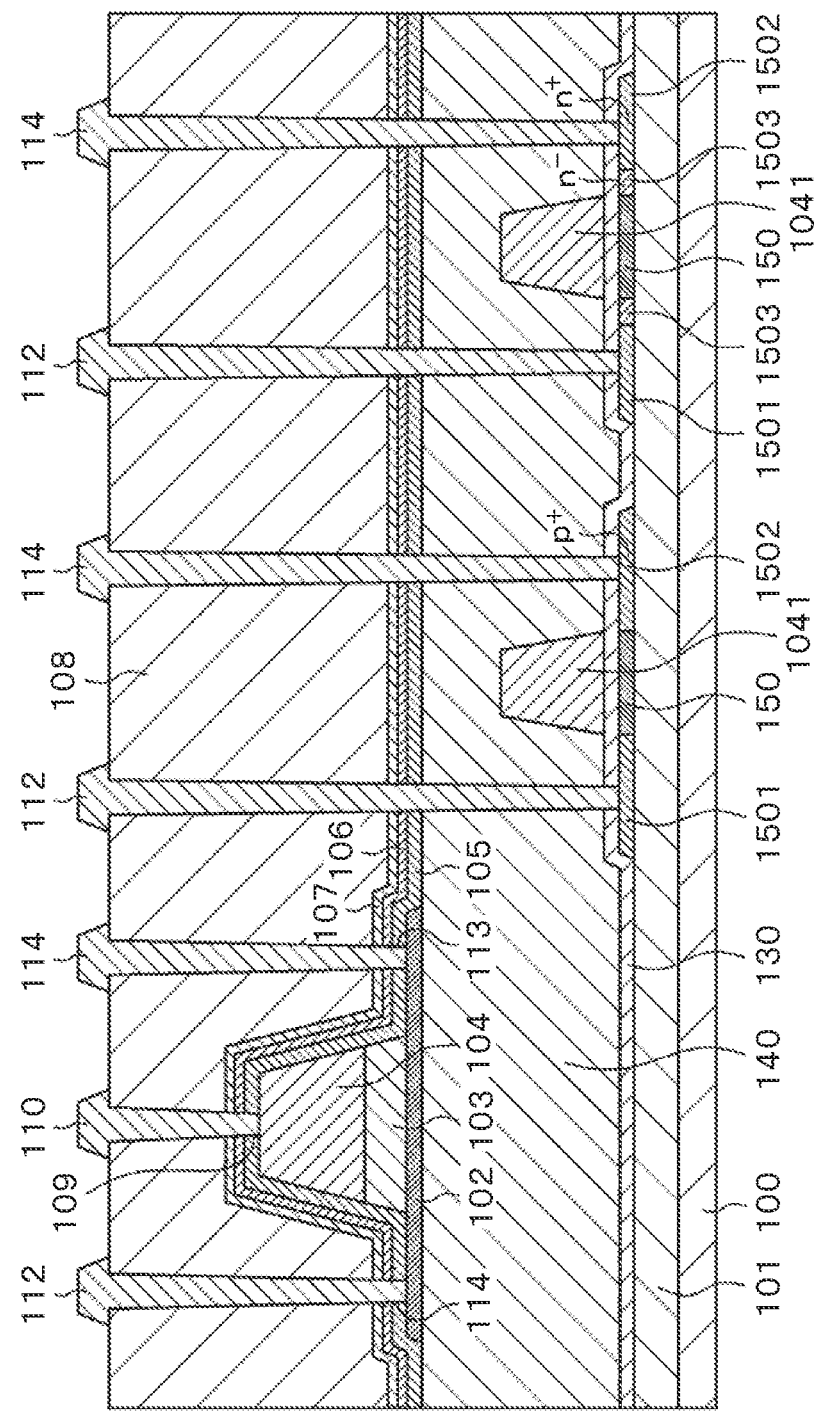
FIG. 25 is a cross section of a TFT circuit board on which an oxide semiconductor TFT of the top-gate type and Poly-Si TFTs are mounted.

FIG. 25 is a cross section illustrating the case where TFTs formed of Poly-Si and a top-gate type TFT formed of an oxide semiconductor are both used. As illustrated in FIG. 25, the undercoat film 101 is formed on the glass-made TFT substrate 100, and Poly-Si 150 is formed on the undercoat film 101 and patterned. The Poly-Si 150 is formed by first depositing a-Si by CVD and then converting it into Poly-Si using an excimer laser. Although the a-Si is converted into the Poly-Si in the present embodiment, the a-Si can instead remain as it is.

In FIG. 25, one of the Poly-Si TFTs is a p-type TFT while the other is an n-type TFT. A gate insulating film 130 is formed to cover the Poly-Si 150, and gate electrodes 1041 are formed on the gate insulating film 130. Ion implantation is then performed using the gate electrodes 1041 as masks to impart electrical conductivity to drains 1501 and sources 1502. In the n-type TFT of FIG. 25, ion implantation is performed using a resist to form a lightly doped drain (LDD) 1503. In FIG. 25, the sections below the gate electrodes 1041 act as channels.

As further illustrated in FIG. 25, a fourth interlayer insulating film 140, which acts as a planarizing film, is formed to cover the Poly-Si TFTs. The fourth interlayer insulating film 140 can be formed of an organic material such as acrylic resin or an inorganic material such as SiN and SiO. The oxide semiconductor 102 is then pattered on the fourth interlayer insulating film 140 to form another TFT. The TFT formed using the oxide semiconductor 102 in FIG. 25 is structurally the same as that of FIG. 2.

In FIG. 25, in order to form through-holes to be connected to the drains 1501 or sources 1502 of the TFTs formed of the Poly-Si 150, the same process as that used for typical Poly-Si TFTs can be used. As described above, Embodiment 3 allows stable fabrication of a hybrid type circuit board on which the top-gate type TFT formed of the oxide semiconductor 102 and the TFTs formed of the Poly-Si 150 are mounted.

Figure 26:
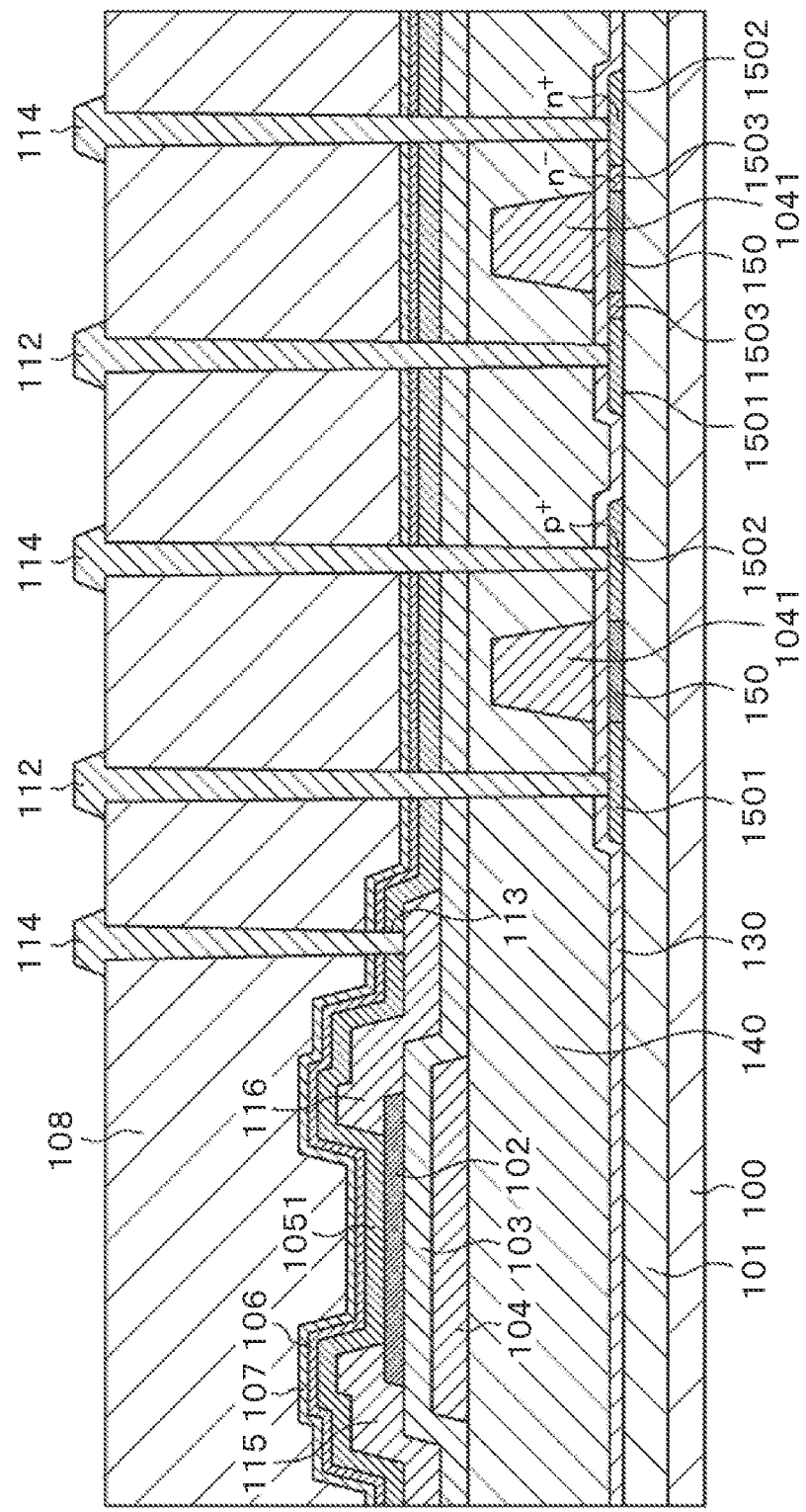
FIG. 26 is a cross section of a TFT circuit board on which an oxide semiconductor TFT of the bottom-gate type and Poly-Si TFTs are mounted.

FIG. 26 is a cross section illustrating the case where TFTs formed of Poly-Si and a bottom-gate type TFT formed of an oxide semiconductor are both used. The Poly-Si TFTs of FIG. 26 are structurally the same as those of Embodiment 3 illustrated in FIG. 25.

As illustrated in FIG. 26, the gate electrode 104 is formed on the fourth interlayer insulating film 140, and the gate insulating film 103 is formed on the gate electrode 104. Further, the oxide semiconductor 102 is formed on the gate insulating film 103. The bottom-gate type TFT formed using the oxide semiconductor 102 in FIG. 26 is structurally the same as that of Embodiment 2, which has been described with reference to FIG. 15. Thus, Embodiment 4 illustrated in FIG. 26 allows stable fabrication of a hybrid type circuit board on which the TFTs formed of the Poly-Si 150 and the bottom-gate type TFT formed of the oxide semiconductor 102 are mounted.

Figure 27:
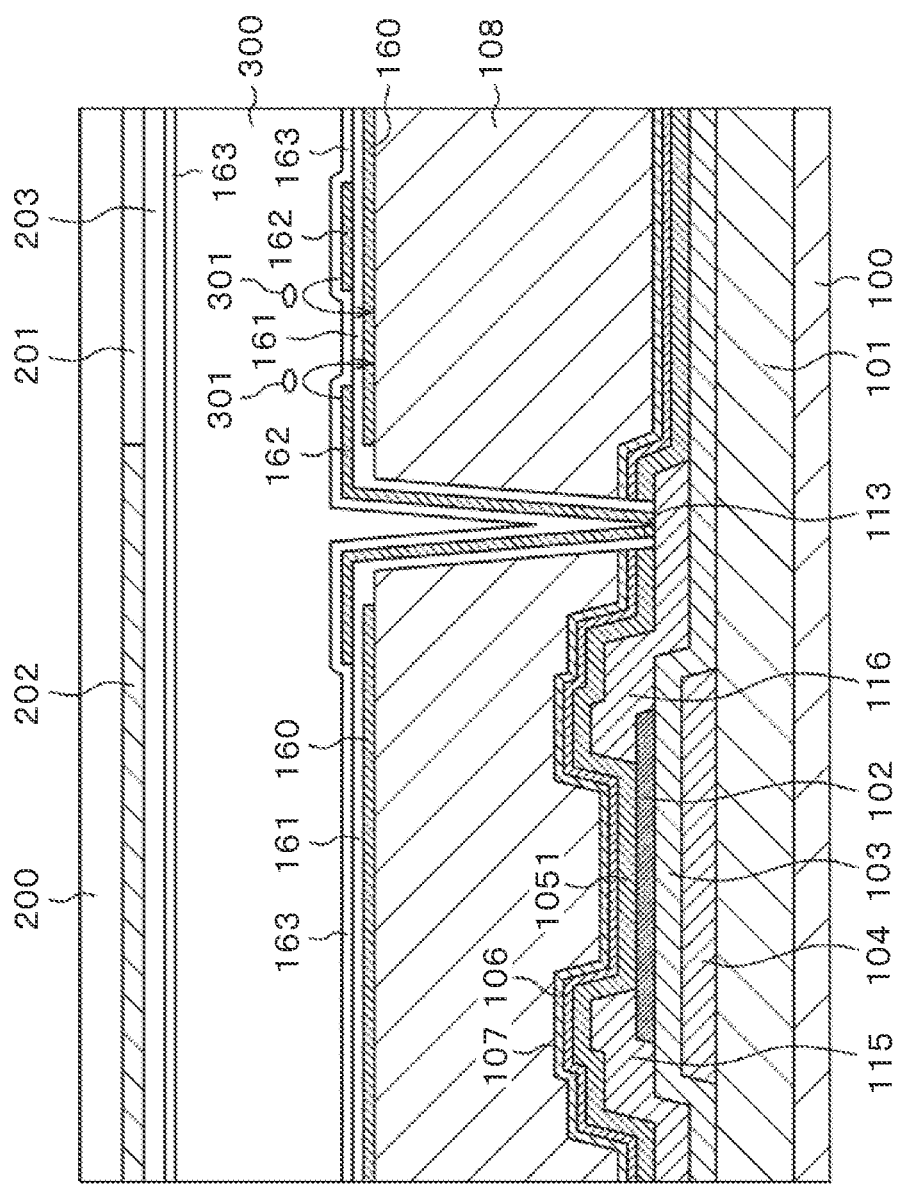
FIG. 27 is a cross section of a liquid crystal display device having a TFT circuit board on which an oxide semiconductor TFT of the bottom-gate type is mounted.

FIG. 27 is a cross section illustrating the case where a bottom-gate type TFT formed of the oxide semiconductor 102 according to the invention is applied to a liquid crystal display device. The liquid crystal display device of FIG. 27 is of the in-plane switching (IPS) system. The structure of FIG. 27 is the same as that of FIG. 15 in terms of the planarizing film 108 and the components located below it. That is, on the drain side of the TFT, the cured film 106 is formed underneath the AlO film 107, or a barrier film, and the third interlayer insulating film 1051 is formed underneath the cured film 106. The presence of the cured film 106 allows stable fabrication of through-holes.

In FIG. 27, the planarizing film 108 is formed of photo-sensitive resin. Thus, through-holes can be formed without a resist. Formed on the planarizing film 108 is a transparent planar electrode, for example, a common electrode 160 formed of ITO. SiN is then used to form a capacitor insulating film 161 on the common electrode 160, and a pixel electrode 162, made of ITO, is further formed on the capacitor insulating film 161 in the form of a comb. Thereafter, an alignment film 163 is formed to cover the pixel electrode 162 and the capacitor insulating film 161.

As further illustrated in FIG. 27, the counter substrate 200 is positioned so as to face the glass substrate 100 with a liquid crystal layer 300 inserted therebetween. Also, a color filter 201 and a black matrix 202 are formed on the inner surface of the counter substrate 200, and these are covered with an overcoat 203. The overcoat 203 is covered with another alignment film 163. In FIG. 27, voltage application between the pixel electrode 162 and the common electrode 160 results in such electric force lines as those shown by the arrows in the figure. This electric field causes liquid crystal molecules 301 to rotate, thereby controlling the amount of light passing through the liquid crystal layer 300 to produce an image.

As illustrated in FIG. 27, since Embodiment 5 allows formation of oxide semiconductor TFTs in pixels, it is possible to achieve a liquid crystal display device that is low in leakage current, produces high quality images, and consumes less power. It should be noted that although FIG. 27 illustrates an oxide semiconductor TFT of the bottom-gate type, an oxide semiconductor TFT of the top-gate type such as the one illustrated in FIG. 2 can instead be used. In addition, as in Embodiments 3 and 4, a hybrid type TFT circuit board on which Poly-Si TFTs are also mounted can be used as well. Moreover, while FIG. 27 illustrates an IPS liquid crystal display device, the invention can also be applied to other types of liquid crystal display devices.

Figure 28:
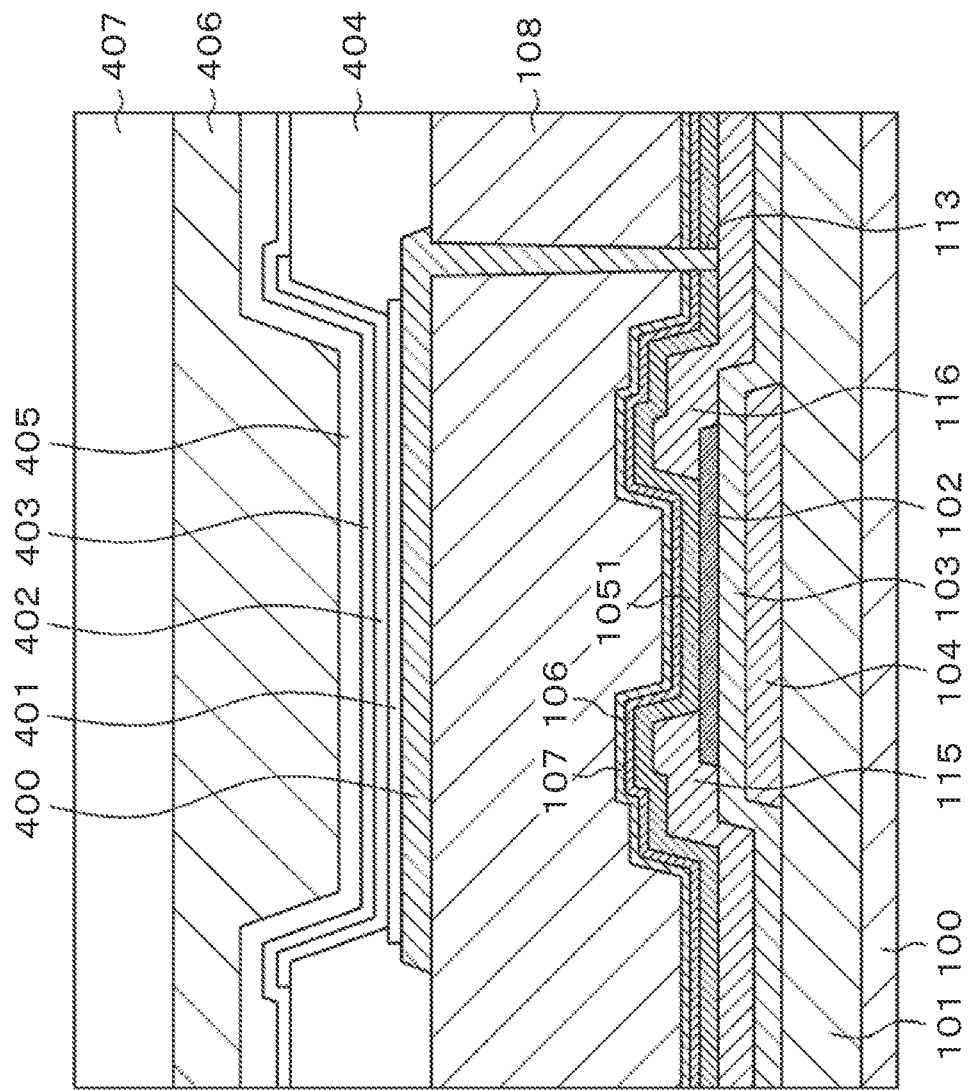
FIG. 28 is a cross section of an organic EL display device having a TFT circuit board on which an oxide semiconductor TFT of the bottom-gate type is mounted.

FIG. 28 is a cross section illustrating the case where an oxide semiconductor TFT of the bottom-gate type according to the invention is applied to an organic EL display device. The structure of FIG. 28 is the same as that of FIG. 15 in terms of the planarizing film 108 and the components located below it. That is, on the drain side of the TFT, the cured film 106 is formed underneath the AlO film 107, or a barrier film, and the third interlayer insulating film 1051 is formed underneath the cured film 106. The presence of the cured film 106 allows stable fabrication of through-holes.

In FIG. 28, the planarizing film 108 is formed of photo-sensitive resin. Thus, through-holes can be formed without a resist. Formed on the planarizing film 108 is a planar reflective film 400, which is made, for example, of Al alloy. The reflective film 400 extends into the source through-hole 113 and connects to the source electrode 116 of the TFT.

As further illustrated in FIG. 28, an anode 401, which is a transparent conductive film made, for example, of ITO, is formed on the reflective film 400. An organic EL film 402 is then formed on the anode 401. The organic EL film 402 is typically formed of multiple organic films. Thereafter, a cathode 403, which is a transparent electrode made, for example, of ITO, is formed on the organic EL film 402. The cathode 403 is shared by all the pixels. The bank 404 of FIG. 28 is used to prevent the disconnection of the thin organic EL layer 402, cathode 403, and so forth resulting from stepped surfaces and also to isolate the pixels. A protective film 405, made of SiN or the like, is then formed to cover the cathode 403. A polarizing plate 407 is then glued to the protective film 405 via an adhesive 406 such that the polarizing plate 407 covers the protective film 405. The polarizing plate 407 is used to prevent light reflection.

Since Embodiment 6 allows stable fabrication of TFTs using the oxide semiconductor 102, it is possible to achieve an organic EL display device that is low in leakage current, produces high quality images, and consumes less power. It should be noted that although FIG. 28 illustrates an oxide semiconductor TFT of the bottom-gate type, an oxide semiconductor TFT of the top-gate type such as the one illustrated in FIG. 2 can instead be used. In addition, as in Embodiments 3 and 4, a hybrid type TFT circuit board on which Poly-Si TFTs are also mounted can be used as well.

What is claimed is:

1. A TFT circuit board comprising;

a substrate;

an undercoat film formed on the substrate;

an oxide semiconductor layer formed on the undercoat film;

a gate insulating film formed on the oxide semiconductor layer; and a gate electrode formed on the gate insulating film, wherein the oxide semiconductor layer includes a first region that is overlapped with the gate electrode, and a second region that is not overlapped with the gate electrode, a first interlayer insulating film is arranged to overlap the first region and the second region, the first interlayer insulating film contains a silicon oxide, and is directly in contact with the oxide semiconductor layer and the gate electrode, a first film is arranged on the first interlayer insulating film, the first film is directly in contact with the first interlayer insulating film, the first film is high-density silicon oxide film, a first AlO film is arranged on the first film, and the first AlO film is directly in contact with the first film, a first thickness of the first interlayer insulating film is 100 nm or more and 500 nm or less, a second thickness of the first film is 10 nm or more and 100 nm or less, and a third thickness of the first AlO film is 10 nm or more and 100 nm or less.

2. The TFT circuit board according to claim 1, wherein the gate insulating film is formed on part of a surface of the oxide semiconductor, the surface facing the gate electrode.

3. The TFT circuit board according to claim 1, wherein a second AlO film is formed between the first interlayer insulating film and the oxide semiconductor, or between the first interlayer insulating film and the gate electrode.

4. The TFT circuit board according to claim 1, wherein the gate electrode has a three-layered structure including a base metal layer, an Al alloy layer, and a capping metal layer.

* * * * *